(12) United States Patent
Awazu et al.

(10) Patent No.: US 11,832,397 B2
(45) Date of Patent: Nov. 28, 2023

(54) PRINTED WIRING BOARD AND METHOD FOR MANUFACTURING PRINTED WIRING BOARD

(71) Applicant: IBIDEN CO., LTD., Gifu (JP)

(72) Inventors: Masashi Awazu, Ogaki (JP); Keisuke Kojima, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/105,768

(22) Filed: Nov. 27, 2020

(65) Prior Publication Data

US 2021/0176866 A1 Jun. 10, 2021

(30) Foreign Application Priority Data

Dec. 9, 2019 (JP) ................. 2019-222027

(51) Int. Cl.
| | |
|---|---|
| *H05K 1/02* | (2006.01) |
| *H05K 1/03* | (2006.01) |
| *H05K 1/09* | (2006.01) |
| *H05K 1/11* | (2006.01) |
| *H05K 1/18* | (2006.01) |
| *H05K 3/10* | (2006.01) |
| *H05K 3/24* | (2006.01) |
| *H05K 3/30* | (2006.01) |

(Continued)

(52) U.S. Cl.
CPC ........... *H05K 3/3452* (2013.01); *H05K 1/116* (2013.01); *H05K 3/422* (2013.01); *H05K 3/4661* (2013.01); *H05K 3/4679* (2013.01); *H05K 2201/09563* (2013.01)

(58) Field of Classification Search
CPC .. H05K 1/02; H05K 1/03; H05K 1/09; H05K 1/11; H05K 1/18; H05K 1/111; H05K 1/113; H05K 3/10; H05K 3/24; H05K 3/30; H05K 3/34; H05K 3/40; H05K 3/46; H05K 3/107; H05K 3/205; H05K 3/284; H01L 21/48; H01L 21/66; H01L 21/683; H01L 21/768; H01L 23/00; H01L 23/31; H01L 23/48; H01L 23/498; H01L 23/525; H01L 23/538
USPC ............... 174/262, 256, 260, 261, 263, 264; 361/720, 746, 748, 767, 78, 803
See application file for complete search history.

(56) References Cited

U.S. PATENT DOCUMENTS

| | | | |
|---|---|---|---|
| 6,828,510 B1* | 12/2004 | Asai ................. | H05K 3/423 174/262 |
| 7,371,974 B2* | 5/2008 | Toyoda ............. | H05K 1/0271 174/262 |

(Continued)

FOREIGN PATENT DOCUMENTS

JP 2003-218286 A 7/2003

*Primary Examiner* — Xiaoliang Chen
(74) *Attorney, Agent, or Firm* — Oblon, McClelland, Maier & Neustadt, L.L.P.

(57) ABSTRACT

A printed wiring board includes a resin insulating layer, via conductors formed in the resin insulating layer, metal posts formed on the via conductors, respectively, and a solder resist layer formed on the resin insulating layer such that the metal posts have lower portions embedded in the solder resist layer and upper portions exposed from the solder resist layer, respectively. The metal posts are formed such that each of the metal posts has a top portion having a diameter in a range of 0.8 to 0.9 times a diameter of a respective one of the lower portions of the metal posts.

20 Claims, 3 Drawing Sheets

(51) Int. Cl.
*H05K 3/34* (2006.01)
*H05K 3/40* (2006.01)
*H05K 3/46* (2006.01)
*H01L 21/48* (2006.01)
*H01L 21/66* (2006.01)
*H01L 21/683* (2006.01)
*H01L 21/768* (2006.01)
*H01L 23/00* (2006.01)
*H01L 23/15* (2006.01)
*H01L 23/31* (2006.01)
*H01L 23/48* (2006.01)
*H01L 23/498* (2006.01)
*H01L 23/525* (2006.01)
*H01L 23/538* (2006.01)
*H05K 3/42* (2006.01)

(56) References Cited

U.S. PATENT DOCUMENTS

| | | | | |
|---|---|---|---|---|
| 9,150,002 B2* | 10/2015 | Lee | H05K 3/181 |
| 9,210,808 B2* | 12/2015 | Kaneko | H01L 21/6835 |
| 9,918,378 B1* | 3/2018 | Shimodaira | H01L 23/49838 |
| 10,636,733 B2* | 4/2020 | Watanabe | H01L 21/6835 |
| 10,681,824 B1* | 6/2020 | Hao | H05K 3/1258 |
| 2001/0050181 A1* | 12/2001 | Miura | H05K 3/3436 |
| | | | 174/256 |
| 2002/0121709 A1* | 9/2002 | Matsuki | H01L 24/05 |
| | | | 257/786 |
| 2003/0230804 A1* | 12/2003 | Kouno | H01L 23/3114 |
| | | | 257/734 |
| 2006/0220221 A1* | 10/2006 | Shimanuki | H01L 23/49838 |
| | | | 257/E23.07 |
| 2008/0314632 A1* | 12/2008 | Wu | H05K 3/4602 |
| | | | 174/263 |
| 2009/0078451 A1* | 3/2009 | Niki | H05K 3/4682 |
| | | | 174/250 |
| 2009/0183906 A1* | 7/2009 | Kobayashi | H01L 23/3114 |
| | | | 174/260 |
| 2010/0009471 A1* | 1/2010 | Mizoguchi | G01R 1/07378 |
| | | | 438/15 |
| 2010/0221414 A1* | 9/2010 | Furuta | H01L 23/49822 |
| | | | 427/98.8 |
| 2010/0263923 A1* | 10/2010 | Kodani | H05K 1/111 |
| | | | 174/260 |
| 2011/0209910 A1* | 9/2011 | Maeda | H05K 3/4682 |
| | | | 29/842 |
| 2011/0304016 A1* | 12/2011 | Nakamura | H01L 21/4857 |
| | | | 257/532 |
| 2012/0006591 A1* | 1/2012 | Kaneko | H05K 3/205 |
| | | | 174/262 |
| 2012/0043371 A1* | 2/2012 | Hayashi | B23K 1/0016 |
| | | | 228/208 |
| 2012/0048914 A1* | 3/2012 | Hayashi | B23K 1/0016 |
| | | | 228/209 |
| 2012/0067635 A1* | 3/2012 | Nang | B23K 3/0623 |
| | | | 228/203 |
| 2012/0152600 A1* | 6/2012 | Nishioka | H05K 3/4007 |
| | | | 174/258 |
| 2013/0003332 A1* | 1/2013 | Lee | C23C 18/32 |
| | | | 174/257 |
| 2013/0069238 A1* | 3/2013 | Usami | H01L 23/53257 |
| | | | 257/769 |
| 2013/0180772 A1* | 7/2013 | Inoue | H05K 3/4007 |
| | | | 228/256 |
| 2013/0341788 A1* | 12/2013 | Machida | H01L 24/13 |
| | | | 257/737 |
| 2014/0347837 A1* | 11/2014 | Kariya | H05K 3/4682 |
| | | | 361/767 |
| 2014/0360768 A1* | 12/2014 | Kang | H01L 21/4853 |
| | | | 174/261 |
| 2015/0077963 A1* | 3/2015 | Adachi | H05K 3/4015 |
| | | | 361/803 |
| 2015/0092356 A1* | 4/2015 | Yoshikawa | H05K 1/113 |
| | | | 361/746 |
| 2015/0092357 A1* | 4/2015 | Yoshikawa | H05K 3/4007 |
| | | | 361/746 |
| 2015/0098204 A1* | 4/2015 | Yoshikawa | H01L 23/49811 |
| | | | 361/767 |
| 2015/0102510 A1* | 4/2015 | Kaneda | H05K 1/115 |
| | | | 257/778 |
| 2015/0156883 A1* | 6/2015 | Bong | H05K 3/4007 |
| | | | 174/266 |
| 2015/0163899 A1* | 6/2015 | Shimizu | H05K 1/0298 |
| | | | 361/767 |
| 2015/0181703 A1* | 6/2015 | Tanaka | H05K 1/0298 |
| | | | 361/748 |
| 2015/0250054 A1* | 9/2015 | Yoshikawa | H01L 25/105 |
| | | | 361/767 |
| 2015/0282307 A1* | 10/2015 | Shimizu | H05K 1/111 |
| | | | 174/264 |
| 2015/0357277 A1* | 12/2015 | Nagai | H05K 3/4007 |
| | | | 174/255 |
| 2016/0066422 A1* | 3/2016 | Sakamoto | H05K 1/181 |
| | | | 361/767 |
| 2016/0172287 A1* | 6/2016 | Arisaka | H05K 1/181 |
| | | | 257/774 |
| 2016/0190079 A1* | 6/2016 | Liao | H01L 24/11 |
| | | | 257/737 |
| 2017/0125359 A1* | 5/2017 | Sakai | H01L 24/92 |
| 2017/0125471 A1* | 5/2017 | Kim | H01L 27/14627 |
| 2017/0141023 A1* | 5/2017 | Arisaka | H01L 24/17 |
| 2017/0213799 A1* | 7/2017 | Inagaki | H01L 21/6835 |
| 2017/0263545 A1* | 9/2017 | Tsukamoto | H01L 21/6835 |
| 2017/0345713 A1* | 11/2017 | Chun | H01L 24/81 |
| 2017/0372997 A1* | 12/2017 | Tsukamoto | H01L 23/3128 |
| 2018/0130759 A1* | 5/2018 | Ho | H01L 23/49811 |
| 2018/0182701 A1* | 6/2018 | Imafuji | H01L 24/17 |
| 2019/0103288 A1* | 4/2019 | Cho | H01L 23/49816 |
| 2019/0198446 A1* | 6/2019 | Sawada | H01L 25/18 |
| 2019/0333849 A1* | 10/2019 | Furuichi | H01L 23/49838 |
| 2020/0043841 A1* | 2/2020 | Arai | H01L 23/49838 |
| 2020/0163214 A1* | 5/2020 | Terauchi | H05K 1/185 |
| 2021/0066210 A1* | 3/2021 | Oh | H01L 23/3128 |
| 2021/0294164 A1* | 9/2021 | Chen | G02F 1/136209 |

* cited by examiner

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2019-222027, filed Dec. 9, 2019, the entire contents of which are incorporated herein by reference.

BACKGROUND OF THE INVENTION

Field of the Invention

The present invention relates to a printed wiring board having metal posts, and a method for manufacturing the printed wiring board.

Description of Background Art

Japanese Patent Application Laid-Open Publication No. 2003-218286 describes a printed wiring board having solder bumps welded on a Cu layer and a Ni layer protruding from openings of an insulating layer. The entire contents of this publication are incorporated herein by reference.

SUMMARY OF THE INVENTION

According to one aspect of the present invention, a printed wiring board includes a resin insulating layer, via conductors formed in the resin insulating layer, metal posts formed on the via conductors, respectively, and a solder resist layer formed on the resin insulating layer such that the metal posts have lower portions embedded in the solder resist layer and upper portions exposed from the solder resist layer, respectively. The metal posts are formed such that each of the metal posts has a top portion having a diameter in a range of 0.8 to 0.9 times a diameter of a respective one of the lower portions of the metal posts.

According to another aspect of the present invention, a method for manufacturing a printed wiring board includes forming an electrolytic plating film on an electroless plating film exposed from a first plating resist layer such that via conductors are formed in openings in the outermost resin insulating layer and that a conductor circuit is formed on a surface of the outermost resin insulating layer, removing the first plating resist layer from the outermost resin insulating layer such that part of the electroless plating film covered by the first plating resist layer is exposed from the electrolytic plating; forming a second plating resist layer on the outermost resin insulating layer such that the second plating resist layer has openings on the via conductors, respectively; applying plating in the openings in the second plating resist layer such that metal posts are formed on the via conductors, respectively; removing the second plating resist layer from the outermost resin insulating layer such that the conductor circuit formed on the outermost resin insulating layer and the part of the electroless plating film exposed from the electrolytic plating are exposed; applying first etching on the part of the electroless plating film exposed from the electrolytic plating film such that the part of the electroless plating film exposed from the electrolytic plating film is removed from the outermost resin insulating layer; forming a solder resist layer on the outermost resin insulating layer such that the solder resist layer covers the conductor circuit and the metal posts formed on the outermost resin insulating layer; reducing a film thickness of the solder resist layer such that the metal posts have upper portions exposed from the solder resist layer and lower portions embedded in the solder resist layer, respectively; and applying second etching on the upper portions of the metal posts such that each of the metal posts has a top portion having a diameter in a range of 0.8 to 0.9 times a diameter of a respective one of the lower portions of the metal posts.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
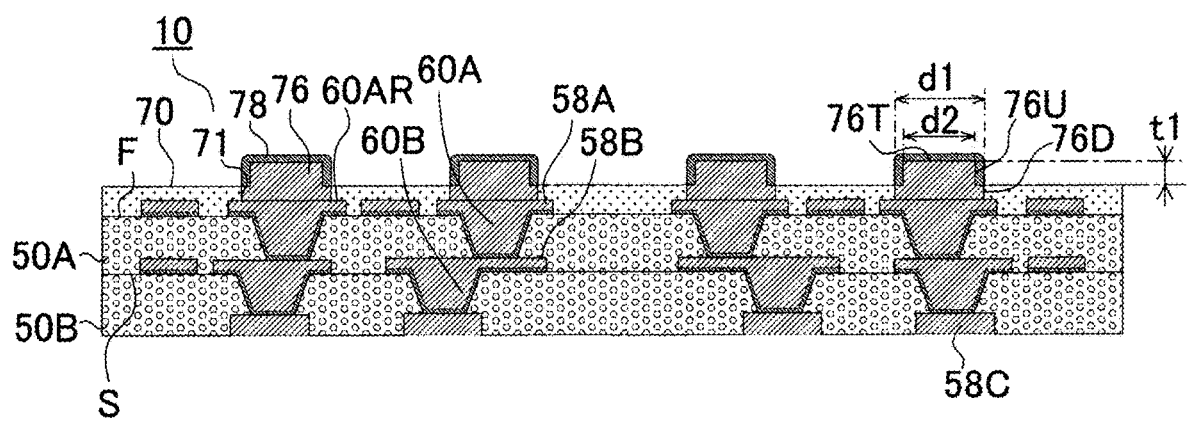
FIGS. 1A-1D are manufacturing process diagrams of a printed wiring board according to an embodiment of the present invention.

Embodiments will now be described with reference to the accompanying drawings, wherein like reference numerals designate corresponding or identical elements throughout the various drawings.

FIG. 1A illustrates a cross section of a printed wiring board 10 of an embodiment. The printed wiring board 10 includes a first resin insulating layer (50A) having a first surface (F) and a second surface (S) on an opposite side with respect to the first surface (F), and a second resin insulating layer (50B) formed on the second surface (S) side of the first resin insulating layer (50A). A first conductor layer (58A) is formed on the first surface (F) of the first resin insulating layer (50A), and a second conductor layer (58B) is formed on the second surface (S) of the first resin insulating layer (50A). First via conductors (60A) that penetrate the first resin insulating layer (50A) and connect the first conductor layer (58A) and the second conductor layer (58B) to each other are formed in the first resin insulating layer (50A). A third conductor layer (58C) is formed on a surface of the second resin insulating layer (50B) on an opposite side with respect to the second surface (S). Second via conductors (60B) that penetrate the second resin insulating layer (50B) and connect the second conductor layer (58B) and the third conductor layer (58C) to each other are formed in the second resin insulating layer (50B). A solder resist layer 70 having openings 71 is formed on the first resin insulating layer (50A), the first conductor layer (58A) and the first via conductors (60A). Metal posts 76 of which upper parts (76U) are respectively exposed by the openings 71 are respectively formed on the first via conductors (60A).

Lower parts (76D) of the metal posts 76 are embedded in the solder resist layer 70. The upper parts (76U) of the metal posts 76 are exposed from the solder resist layer 70. A surface treatment layer 78 formed of a Ni/Pd/Au layer is formed the exposed part of each of the metal posts 76 exposed from the solder resist layer. A diameter (d1) of a lowermost portion of the lower part (76D) of each of the metal posts 76 is 40 μm-50 μm. A diameter (d2) of a top part (a flat part of a front end) (76T) of each of the metal posts 76 is 0.8-0.9 times the diameter (d1) of the lower part (76D). The exposed portion (upper part (76U)) of each of the metal posts 76 exposed from the solder resist layer 70 has a height (t1) of 3 μm-10 μm. The surface treatment layer 78 has a thickness of 1 μm. A height of a surface of the surface treatment layer 78 provided on each of the metal posts 76 is 4 μm-11 μm relative to the solder resist layer.

According to the printed wiring board 10 of the embodiment, the diameter (d2) of the top part (76T) of each of the metal posts is 0.8-0.9 times the diameter (d1) (40 μm-50 μm) of the lower part (76D) of each of the metal posts 76 of which the lower parts (76D) are embedded in the solder resist layer 70 and the upper parts (76U) are exposed from the solder resist layer 70. The height (t1) of the exposed portion (the upper part (76U)) of each of the metal posts 76 exposed from the solder resist layer 70 is 3 μm or more. Since the diameter of the top part (76T) of each of the metal posts 76 is not too small and the height is not too low, two terminals can be easily brought into contact with the metal posts 76 exposed from the solder resist layer, and a resistance can be accurately measured using a 4-terminal checker. Since the height (t1) of the exposed portion (upper part (76U)) of each of the metal posts 76 exposed from the solder resist layer 70 is 10 μm or less, the metal posts 76 can be formed at a fine pitch. Since the front end of the exposed part (76U) of each of the metal posts 76 exposed from the solder resist layer is thin, adhesion between the exposed part (76U) and the surface treatment layer 78 can be increased.

Method for Manufacturing Printed Wiring Board

Figure 1B:
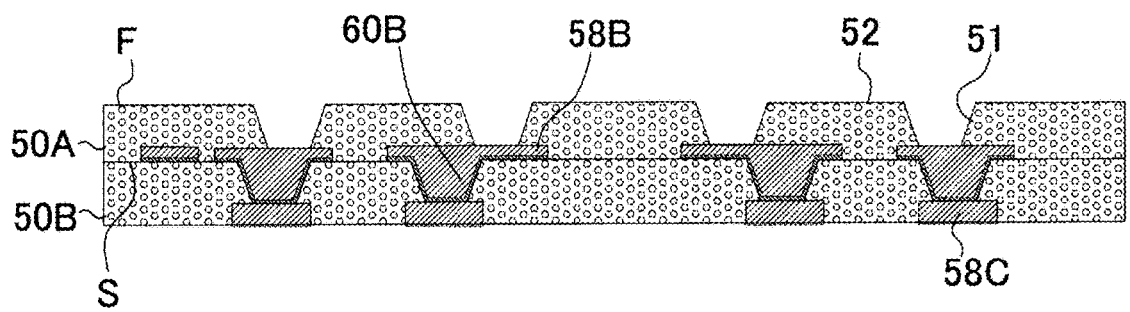

Using a known manufacturing method, the first resin insulating layer (50A) is laminated on the second resin insulating layer (50B) on or in which the second conductor layer (58B), the third conductor layer (58C), and the second via conductors (60B) are formed, and via openings 51 are formed (FIG. 1B).

Figure 1C:
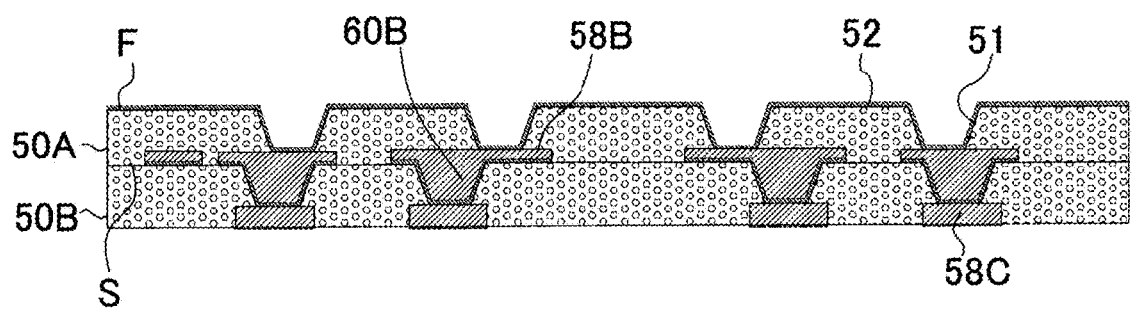
Figure 1D:
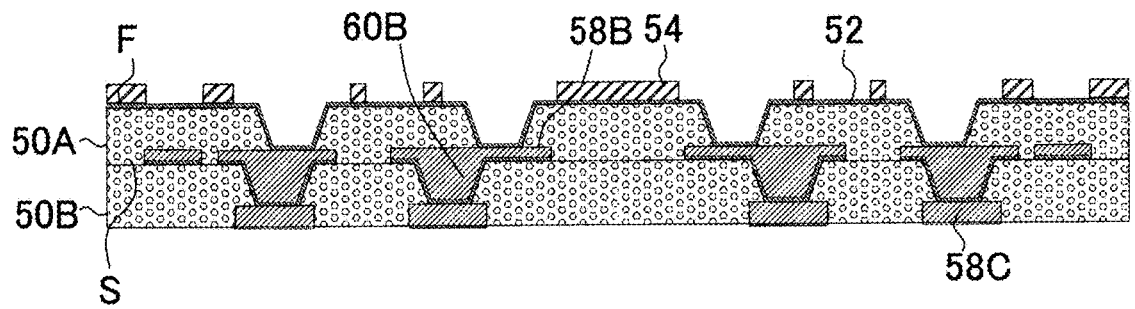
Figure 2A:
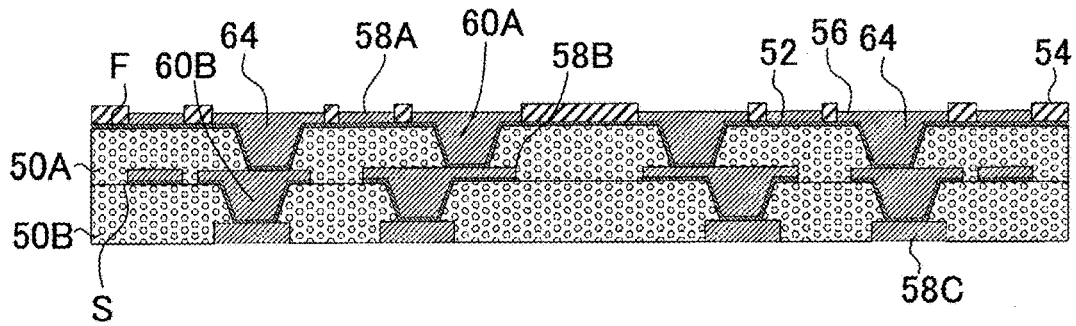
FIGS. 2A-2D are manufacturing process diagrams of the printed wiring board of the embodiment.

By electroless plating, an electroless plating film 52 is formed on the surface of the first resin insulating layer (50A), and in the openings 51 (FIG. 1C). A first plating resist 54 of a predetermined pattern is formed on the electroless plating film 52 (FIG. 1D). By electrolytic plating, the (filled vias) first via conductors (60A) formed of an electrolytic plating film 64 are formed in the openings 51 exposed from the first plating resist 54, and the first conductor layer (58A) is formed on the electroless plating film 52 on the first resin insulating layer (50A) (FIG. 2A).

Figure 2B:
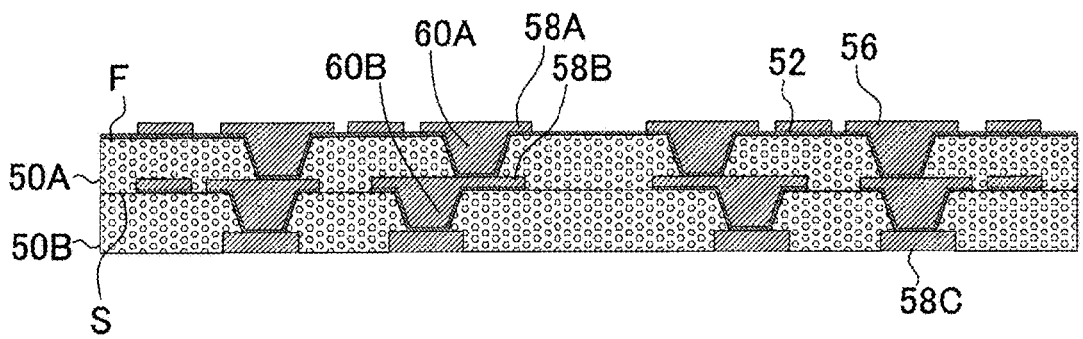
Figure 2C:
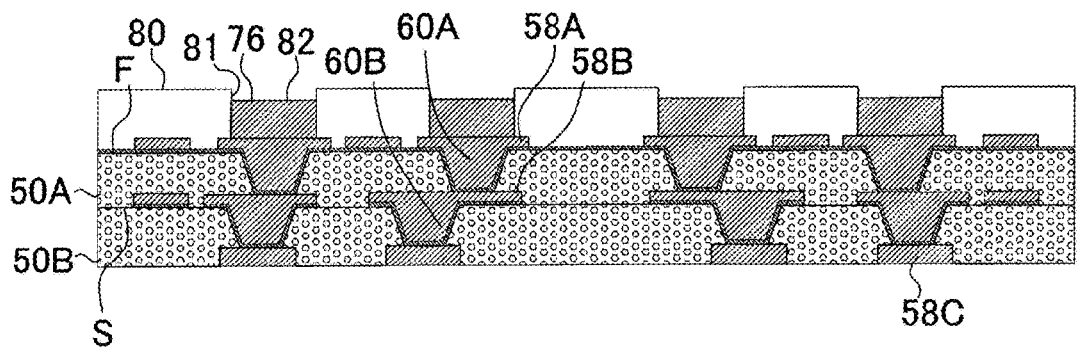
Figure 2D:
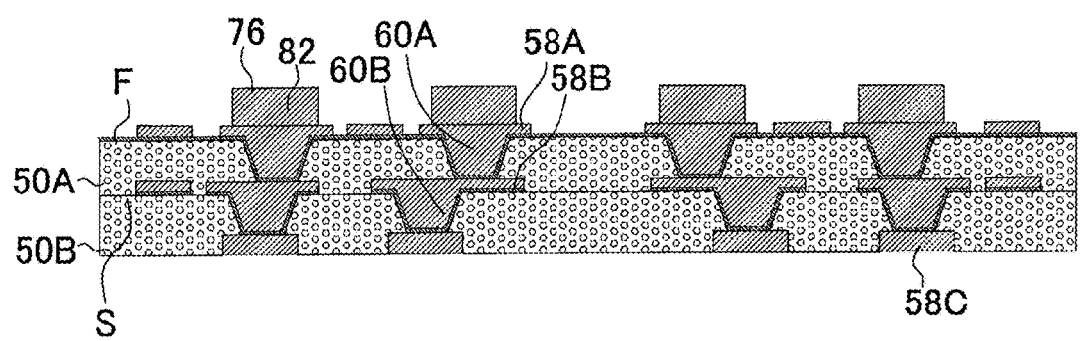
Figure 3A:
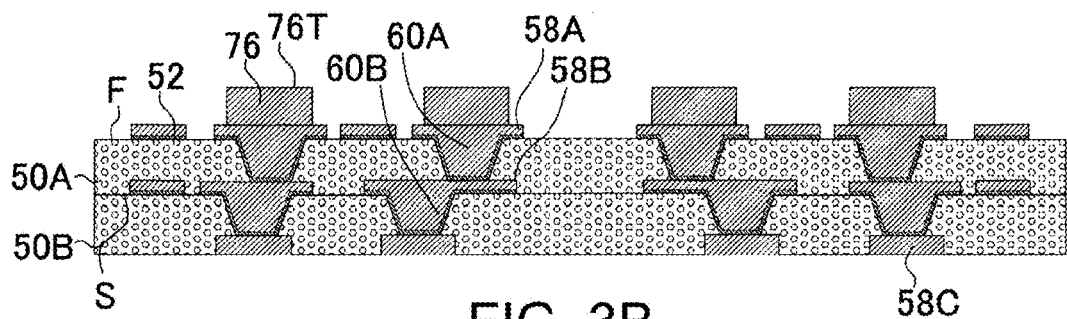
FIGS. 3A-3E are manufacturing process diagrams of the printed wiring board of the embodiment.

The first plating resist is peeled off (FIG. 2B). A second plating resist 80 having openings 81 on the first via conductors (60A) is formed on the first conductor layer (58A) and the electroless plating film 52, and, by electrolytic plating, the metal posts 76 formed of an electrolytic plating film 82 are formed in the openings 81 (FIG. 2C). The second plating resist is removed (FIG. 2D). The electroless plating film 52 exposed from the first conductor layer 58 is removed by first etching (FIG. 3A).

Figure 3B:
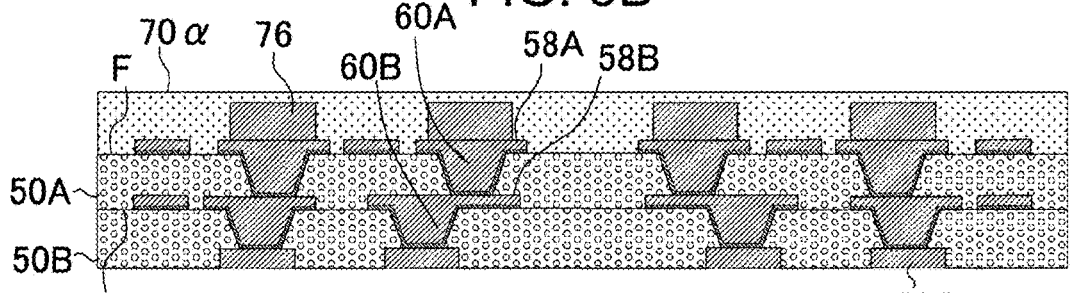
Figure 3C:
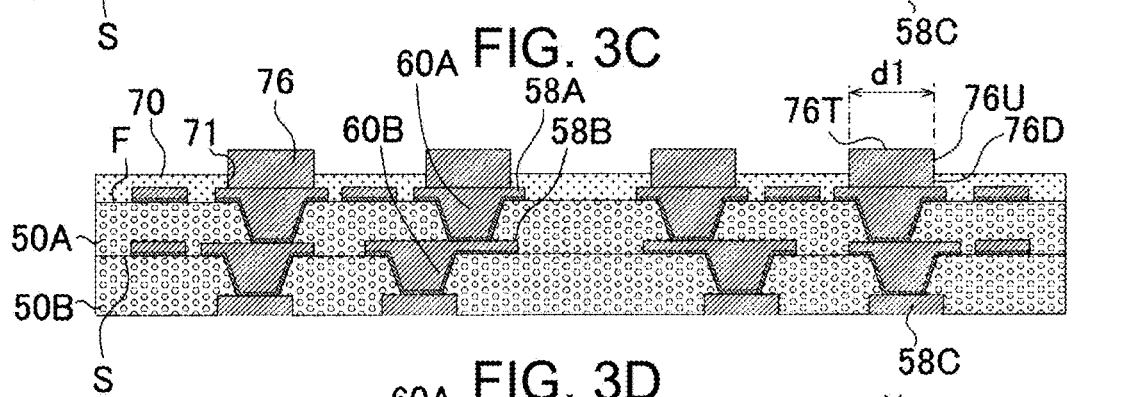

A solder resist composition (70a) is formed so as to embed the first conductor layer (58A) and the metal posts 76 (FIG. 3B). The solder resist composition is thinned by etching, the upper parts (76U) of the metal posts 76 are exposed, and the solder resist composition is cured to form the solder resist layer 70 (FIG. 3C).

Figure 3D:
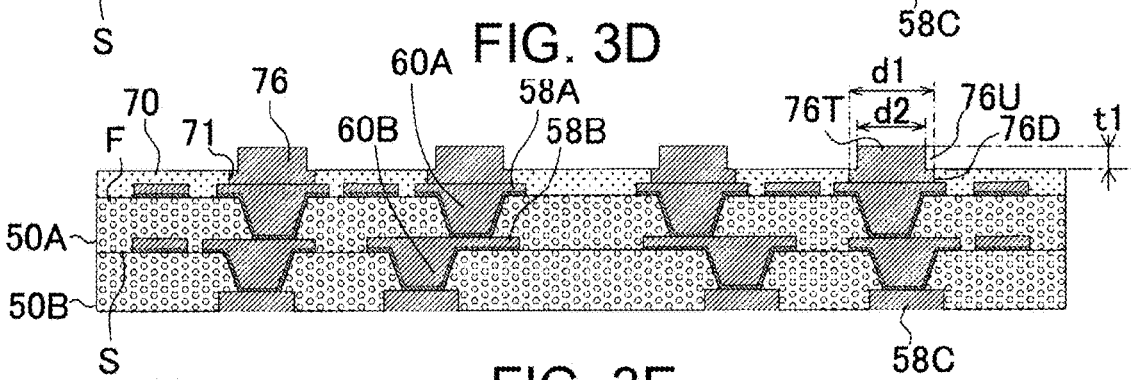
Figure 3E:
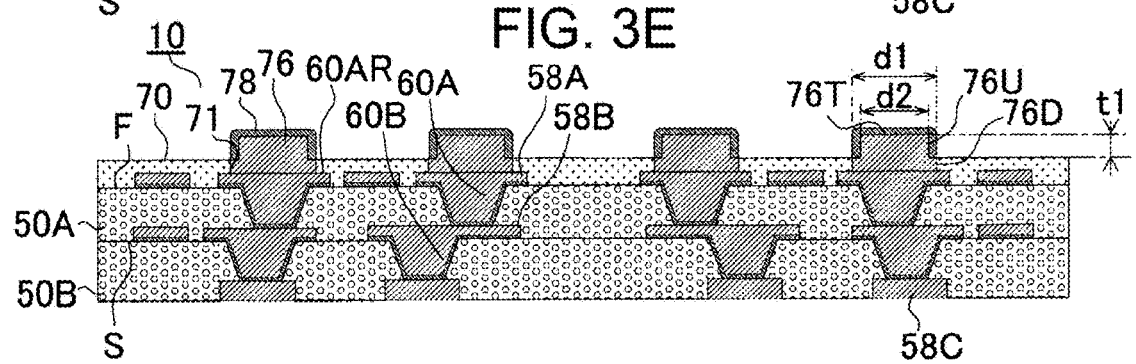

The exposed upper parts (76U) of the metal posts 76 are subjected to a soft etching (second etching) treatment before the formation of the surface treatment layer (FIG. 3D). Due to the above-described first etching and this second etching, the diameter (d2) of the top part (76T) (flat part of the front end) of each of the metal posts 76 is 0.8-0.9 times the diameter (d1) of the lower part (76D). The height (t1) of the exposed portion (upper part (76U)) of each of the metal posts 76 exposed from the solder resist layer 70 is 3 μm-10 μm.

The surface treatment layer 78 formed of a Ni/Pd/Au layer is formed on the exposed upper part (76U) of each of the metal posts 76, and the printed wiring board 10 is completed (FIG. 1A). The thickness of the surface treatment layer 78 is 1 μm, and the height of the surface of the surface treatment layer 78 provided on each of the metal posts 76 is 4 μm-11 μm relative to the solder resist layer.

In the method for manufacturing the printed wiring board of the embodiment, the lower parts (76D) are embedded in the solder resist layer 70, and, due to the first etching and the second etching, the diameter (d2) of the top part (76T) of each of the metal posts 76 is 0.8-0.9 times the diameter (d1) of the lower part (76D) of each of the metal posts 76. Since the diameter of the top part (76T) of each of the metal posts 76 is not too small, two terminals can be easily brought into contact with the metal posts 76 exposed from the solder resist layer, and a resistance can be accurately measured using a 4-terminal checker. Since the front end of the exposed part (76U) of each of the metal posts 76 exposed from the solder resist layer is thin, adhesion between the exposed part (76U) and the surface treatment layer 78 can be increased.

In Japanese Patent Application Laid-Open Publication No. 2003-218286, the solder bumps each have a small diameter, and it is thought to be difficult to bring two terminals into contact with the solder bumps at the same time and resistance measurement using a 4-terminal checker is difficult. Further, since the Cu layer and the Ni layer are formed in a cylindrical shape, it is thought that adhesion between the Cu layer and the Ni layer and the welded solder bumps is low.

A printed wiring board according to an embodiment of the present invention includes: via conductors that are formed in a resin insulating layer; metal posts that are respectively formed on the via conductors; and a solder resist layer that is formed on the resin insulating layer and embeds lower parts of the metal posts and exposes upper parts of the metal posts. A diameter of a top part of each of the metal posts is 0.8-0.9 times a diameter of the lower part of each of the metal posts.

A method for manufacturing a printed wiring board according to another embodiment of the present invention includes: forming multiple via openings in an outermost resin insulating layer; forming an electroless plating film on a surface of the outermost resin insulating layer and in the via openings; forming a first plating resist layer on the electroless plating film; forming via conductors and a conductor circuit by forming an electrolytic plating film on the electroless plating film exposed from the first plating resist layer; peeling off the first plating resist layer; forming a second plating resist layer having openings on the via conductors; forming metal posts by plating in the openings of the second plating resist layer; peeling off the second plating resist layer; removing the electroless plating film exposed from the electrolytic plating film by first etching; forming a solder resist layer on the electrolytic plating film and the metal posts; reducing a film thickness of the solder resist layer to expose upper portions of the metal posts; subjecting the upper portions of the metal posts to second etching; and providing a surface treatment layer on an exposed portion of each of the metal posts exposed from the solder resist layer. Due to the second etching, a diameter of a top part of each of the metal posts is 0.8-0.9 times a diameter of a lower part of each of the metal posts.

According to embodiments of the printed wiring board of the present invention and the method for manufacturing the printed wiring board, the diameter of the top part of each of the metal posts is 0.8-0.9 times the diameter of the lower part of each of the metal posts of which the lower parts are embedded in the solder resist layer and the upper parts are exposed from the solder resist layer. Since the diameter of the top part of each of the metal posts is not too small, two terminals can be easily brought into contact with the metal posts exposed from the solder resist layer, and a resistance can be accurately measured using a 4-terminal checker. Since the front end of the exposed part of each of the metal posts exposed from the solder resist layer is thin, adhesion between the exposed part and the surface treatment layer can be increased.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a resin insulating layer;
   a plurality of via conductors formed in the resin insulating layer;
   a conductor layer formed on a surface of the resin insulating layer such that the plurality of via conductors and the conductor layer comprise an electroless plating film and an electrolytic plating film formed on the electroless plating film;
   a plurality of metal posts formed on the electrolytic plating film of the conductor layer such that the plurality of metal posts is positioned on the plurality of via conductors, respectively; and
   a solder resist layer formed on the resin insulating layer such that the conductor layer formed on the surface of the resin insulating layer is embedded in the solder resist layer and that the plurality of metal posts has a plurality of lower portions embedded in the solder resist layer and a plurality of upper portions protruding and exposed from the solder resist layer,
   wherein the plurality of metal posts is formed such that each of the metal posts has a top portion having a diameter in a range of 0.8 to 0.9 times a diameter of a respective one of the lower portions of the metal posts and that each of the upper portions of the metal posts has a height measured from a surface of the solder resist layer in a range of 3 μm to 10 μm and is formed integrally with a respective one of the lower portions.

2. The printed wiring board according to claim 1, further comprising:
   a surface treatment layer formed on an exposed portion of each of the metal posts exposed from the solder resist layer.

3. The printed wiring board according to claim 2, wherein the surface treatment layer includes a Ni/Pd/Au layer.

4. The printed wiring board according to claim 2, wherein the surface treatment layer is formed on each of the metal posts such that a height of a surface of the surface treatment layer on a respective one of the metal posts is in a range of 4 μm to 11 μm relative to the solder resist layer.

5. The printed wiring board according to claim 1, wherein the plurality of metal posts is formed such that each of the lower potions of the metal posts has a diameter in a range of 40 μm to 50 μm.

6. The printed wiring board according to claim 3, wherein the surface treatment layer is formed on each of the metal posts such that a height of a surface of the surface treatment layer on a respective one of the metal posts is in a range of 4 μm to 11 μm relative to the solder resist layer.

7. The printed wiring board according to claim 2, wherein the plurality of metal posts is formed such that each of the lower potions of the metal posts has a diameter in a range of 40 μm to 50 μm.

8. The printed wiring board according to claim 3, wherein the plurality of metal posts is formed such that each of the lower potions of the metal posts has a diameter in a range of 40 μm to 50 μm.

9. The printed wiring board according to claim 4, wherein the plurality of metal posts is formed such that each of the lower potions of the metal posts has a diameter in a range of 40 μm to 50 μm.

10. The printed wiring board according to claim 6, wherein the plurality of metal posts is formed such that each of the lower potions of the metal posts has a diameter in a range of 40 μm to 50 μm.

11. The printed wiring board according to claim 2, wherein the surface treatment layer is a Ni/Pd/Au layer.

12. The printed wiring board according to claim 11, wherein the surface treatment layer is formed on each of the metal posts such that a height of a surface of the surface treatment layer on a respective one of the metal posts is in a range of 4 μm to 11 μm relative to the solder resist layer.

13. The printed wiring board according to claim 11, wherein the plurality of metal posts is formed such that each of the lower potions of the metal posts has a diameter in a range of 40 μm to 50 μm.

14. The printed wiring board according to claim 12, wherein the plurality of metal posts is formed such that each of the lower potions of the metal posts has a diameter in a range of 40 μm to 50 μm.

15. The printed wiring board according to claim 1, wherein the plurality of metal posts is formed such that the plurality of metal posts comprises plating material.

16. A method for manufacturing a printed wiring board, comprising:
   forming an electrolytic plating film on an electroless plating film exposed from a first plating resist layer such that a plurality of via conductors is formed in a plurality of openings in an outermost resin insulating layer and that a conductor layer including a conductor circuit is formed on a surface of the outermost resin insulating layer;
   removing the first plating resist layer from the outermost resin insulating layer such that part of the electroless plating film covered by the first plating resist layer is exposed from the electrolytic plating;
   forming a second plating resist layer on the outermost resin insulating layer such that the second plating resist layer has a plurality of openings on the plurality of via conductors, respectively;
   applying plating in the plurality of openings in the second plating resist layer such that a plurality of metal posts is formed on the electrolytic plating film of the conductor layer and that the plurality of metal posts is positioned on the plurality of via conductors, respectively;
   removing the second plating resist layer from the outermost resin insulating layer such that the conductor circuit formed on the outermost resin insulating layer and the part of the electroless plating film exposed from the electrolytic plating are exposed;
   applying first etching on the part of the electroless plating film exposed from the electrolytic plating film such that the part of the electroless plating film exposed from the electrolytic plating film is removed from the outermost resin insulating layer;

forming a solder resist layer on the outermost resin insulating layer such that the conductor layer including the conductor circuit and the plurality of metal posts formed on the outermost resin insulating layer are embedded in the solder resist layer;

reducing a film thickness of the solder resist layer such that the conductor layer including the conductor circuit is embedded in the solder resist layer and that the plurality of metal posts has a plurality of upper portions protruding and exposed from the solder resist layer and a plurality of lower portions embedded in the solder resist layer, respectively; and applying second etching on the upper portions of the plurality of metal posts such that each of the metal posts has a top portion having a diameter in a range of 0.8 to 0.9 times a diameter of a respective one of the lower portions of the metal posts and that each of the upper portions of the metal posts has a height measured from the surface of the solder resist layer in a range of 3 μm to 10 μm and is formed integrally with a respective one of the lower portions.

17. The method for manufacturing a printed wiring board according to claim 16, further comprising:

forming a surface treatment layer on an exposed portion of each of the metal posts exposed from the solder resist layer.

18. The method for manufacturing a printed wiring board according to claim 16, further comprising:

forming the plurality of via openings in the outermost resin insulating layer;

forming the electroless plating film on the surface of the outermost resin insulating layer and in the plurality of via openings; and forming a first plating resist layer on the electroless plating film such that the first plating resist layer exposes part of the electroless plating layer for forming the plurality of via conductors and the conductor circuit.

19. The method for manufacturing a printed wiring board according to claim 16, wherein the reducing of the film thickness of the solder resist layer comprises applying etching on the solder resist layer.

20. The method for manufacturing a printed wiring board according to claim 17, wherein the reducing of the film thickness of the solder resist layer comprises applying etching on the solder resist layer.

* * * * *